(12) United States Patent
Tsai et al.

(10) Patent No.: US 6,272,866 B1
(45) Date of Patent: Aug. 14, 2001

(54) MICRO COOLING ENGINE ARRAY SYSTEM

(75) Inventors: Ming-Jye Tsai; Tsung-Han Tsai, both of Hsinchu; Ruei-Hung Jang, Taipei, all of (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 09/456,628

(22) Filed: Dec. 8, 1999

(51) Int. Cl.[7] ............................. F25B 21/00; F25B 9/00
(52) U.S. Cl. ............................. 62/3.1; 62/6; 62/259.2
(58) Field of Search .................. 62/6, 259.2, 3.1; 60/520

(56) References Cited

U.S. PATENT DOCUMENTS

| | | | |
|---|---|---|---|
| 5,056,317 | * 10/1991 | Stetson | 62/6 |
| 5,419,780 | * 5/1995 | Suski | 136/205 |
| 5,457,956 | * 10/1995 | Bowman et al. | 60/520 |
| 5,749,226 | * 5/1998 | Bowman et al. | 60/520 |
| 5,867,991 | * 2/1999 | Jalink et al. | 62/6 |

* cited by examiner

Primary Examiner—William Doerrler
(74) Attorney, Agent, or Firm—Knobbe, Martens, Olson & Bear, LLP

(57) ABSTRACT

A micro cooling engine array system is fabricated by micro electro mechanical system technology for cooling heat sources. The micro cooling engine array system includes a matrix, which is laminated by several layers of metal or polymer. A plurality of cooling engines are arrayed in the matrix for pumping heat out of heat sources. Each cooling engine of the array system has an expansion space, regenerator, and compression space. Pairs of plane coil and magnetic region actuate two flexible diaphragms to expand the expansion space and compress the compression space. The heat of heat sources can thus be pumped out by the array system repeatedly changing the volumes of the expansion and compression spaces.

19 Claims, 3 Drawing Sheets

MICRO COOLING ENGINE ARRAY SYSTEM

FIELD OF THE INVENTION

This invention relates to a micro cooling engine which applies Stirling Cycle to pump heat out of a heat source, and more particularly to a micro cooling engine array system to further miniaturize the size of each of its arrayed micro cooling engines for improving the cooling efficiency.

BACKGROUND OF THE INVENTION

In many electronic apparatuses, cooling is a vital issue to ensure them operating in a desired temperature for better performance. Chips are always the main heat sources of electronic apparatuses. Therefore, many cooling devices are designed to cool the electronic apparatuses, especially in chips. Traditionally, the cooling devices, such as fin, foaming material, fan, and heat pipe, improves the thermal conductivity of heat source by increasing thermal-conductive area, circulating thermal-convective fluid, and employing cooling media. However these cooling devices are not efficient enough to cool the modern electronic apparatuses with chips of high circuit integration generating huge thermal energy.

A miniature pumping system, which is fabricated on a substrate by micro electro mechanical (MSMS) technology, is a new approach to solve the cooling issue of chips. The miniature pumping system employs mini pump to convey working fluid circling around a heat source, such as a chip, for cooling it. Because the mini pump's size is on the order of several millimeters, the fabrication of miniature pumping system still faces challenges and needs more studies.

Another novel cooling device is a micro-miniature stirling cycle cooling engine, which implants a stirling cycle cooling engine in a silicon based matrix by semiconductor processing technology. The Stirling Cycle describes the behavior of ideal gas during a period of expansion and compression. According to the stirling cycle, the ideal gas absorbs heat during expansion and ejects heat during compression. A conventional stirling cycle cooling engine employs a vessel in which the volume of fluid could be expanded and compressed, so that heat can be absorbed from a heat source during expansion and ejected out of the vessel during compression. The higher frequency of the stirling cycle increases the cooling efficiency the stirling cycle cooling engine. In U.S. Pat. No. 5,590,534, it is reported that the general frequency of conventional stirling cycle cooling engine is about 50 Hz. In U.S. Pat. No. 5,457,956, it is disclosed a micro-miniature stirling cycle cooling engine implanted in a silicon-based matrix. Because of the further reduced size, the microminiature stirling cycle cooling engine can be operated in a frequency higher than 500 Hz, thereby providing a better cooling efficiency. In addition, the micro-miniature stirling cycle cooling engine can be directly fabricated on the back side of chip so as to tightly bond between the cooling engine with the chip.

Even though the micro-miniature stirling cycle cooling engine has remarkably improved the conventional stirling cycle cooling engine, it still exists several needs and disadvantages. The smaller size of the micro-miniature stirling cycle cooling engine has, the higher cooling efficiency it has, due to the fluid therein acting more like the ideal gas. Therefore, there is a need to further downsize the cooling engine. In addition, sicne the thermal distribution of heat source is not uniform over its surface and the single micro-miniature stiling cycle cooling engine doesn't pump heat evening, there's also a huge need to optimize cooling capacity distribution of micro-miniature stirling cycle cooling engine. Additionally, the micro-miniature stirling cycle cooling engine of U.S. Pat. No. 5,457,956 employs a piezoelectric layer as an actuator to drive a diaphragm for expanding or compressing the fluid. However, the piezoelectric layer costs a period time to deformation due to its hysteresis. Furthermore, fabricating the micro-miniature stirling cycle cooling engine on the back side of chip would raise a risk to damage the chip by added process, such as further thermal treatment. For forming a cooling engine, the cost of chip is too high to be wasted in a failed fabrication.

Accordingly, there is a huge need to improve the micro-miniature stirling cycle cooling engine for adapting to modern electronic apparatuses and chips.

SUMMARY OF THE INVENTION

An object of the invention is to improve a conventional micro-miniature stirling cycle cooling engine for increasing the operating frequency by arraying many engines into a matrix.

Another object of the invention is to fabricate the micro cooling engine array system by MEMS technology so as to avoid the risk of damaging based chips and provide a better flexibility of using this array system.

The present micro cooling engine array system is fabricated by micro electro mechanical system technology for cooling heat sources. The micro cooling engine array system includes a matrix, which is laminated by several layers. Many cooling engines, each of which comprises a heat-absorbing end, regenerator, and heat-ejecting end, are arrayed in the matrix for pumping heat out of heat sources. The heat-absorbing end includes an expansion space and first back space, which are divided by a first flexible diaphragm. A first plane coil mounted on the first flexible diaphragm cooperates with a buried magnetic region of first plate to expand the expansion space. The volume of the working fluid contained in the expansion space increases to absorb the heat from the heat source. Then the working fluid flows through the regenerator to the heat-ejecting end. Similarly, the volume of a compression space of heat-ejecting end would reduce so that the working fluid releases heat out of the micro cooling engine array.

This invention further divides the conventional micro-miniature stirling cycle cooling engine into many downsized cooling engines. Therefore, each cooling engine has a higher operating frequency than the conventional one. Meanwhile, arraying the cooling engines into an array system can provide the same cooling capability with the conventional one in the same cooling area. The micro cooling engine array system actuated by pairs of plane coil and magnetic region is quicker in response to input voltages for generating magnetic force than the conventional one. In addition, the micro cooling engine array system is based on metal or polymer materials, so that it avoids the risk of damaging based chips and provides a better using flexibility.

DETAILED DESCRIPTION OF THE PREFERRED EMBODIMENTS

This invention discloses a micro cooling engine array system for improving the conventional micro-miniature stirling cycle cooling engine, which is fabricated based on a silicon-based matrix. Dividing the conventional micro-miniature stirling cycle cooling engine into a micro cooling engine array increases the pumping frequency for each engine of the array system, so as to provide a better cooling efficiency. Building the micro cooling engine array on metal and polymer materials by MENS technology can avoid the risk of damaging the chip base. In above advantages, a micro cooling engine array system based on metal and polymer materials is described as the following paragraphs for implementing this invention. An alternative of the micro cooling engine array is them illustrated for supplement of the invention.

Figure 1:
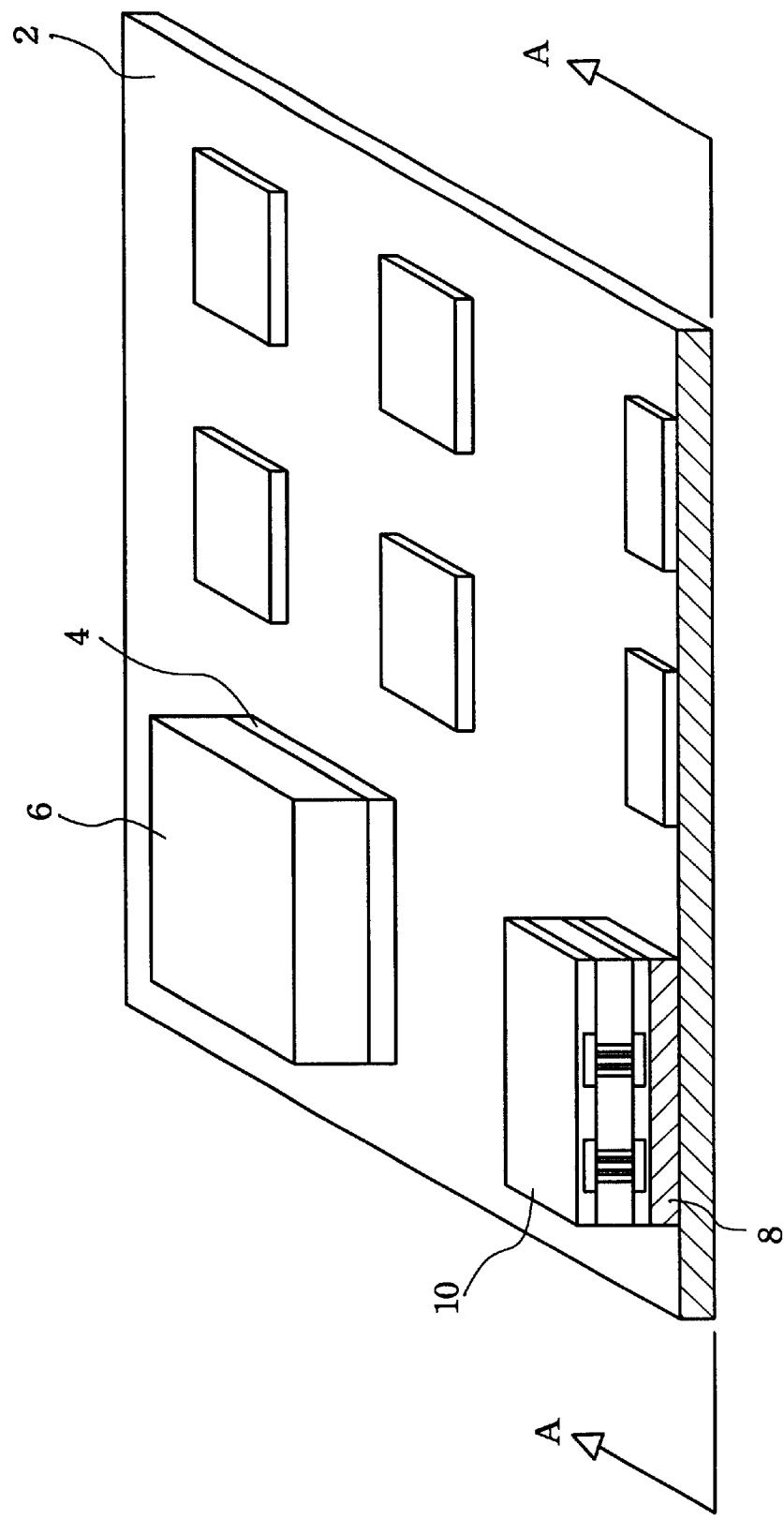
FIG. 1 is a view of micro cooling engine array systems mounted on chips of a circuit board.

Referring to FIG. 1, several chips 4, 8 are mounted on a circuit board 2, usually appear in electronic apparatus, such as PCs, televisions. The integrated circuits of the chips 4, 8 contribute a major portion of heat the circuit board generates. Most chips have better performances at a relatively low temperature environment. Each of the micro cooling engine array systems 6, 10, encloses many stirling cycle cooling engines. The systems 6 and 10 are respectively mounted on the chips 4, 8 for pumping heat out. As a result of being not built on the back side of the chips 4, 8, the micro cooling engine array system can be separated form the chips 4, 8 and attached to any heat sources for controlling their temperature.

Figure 2:
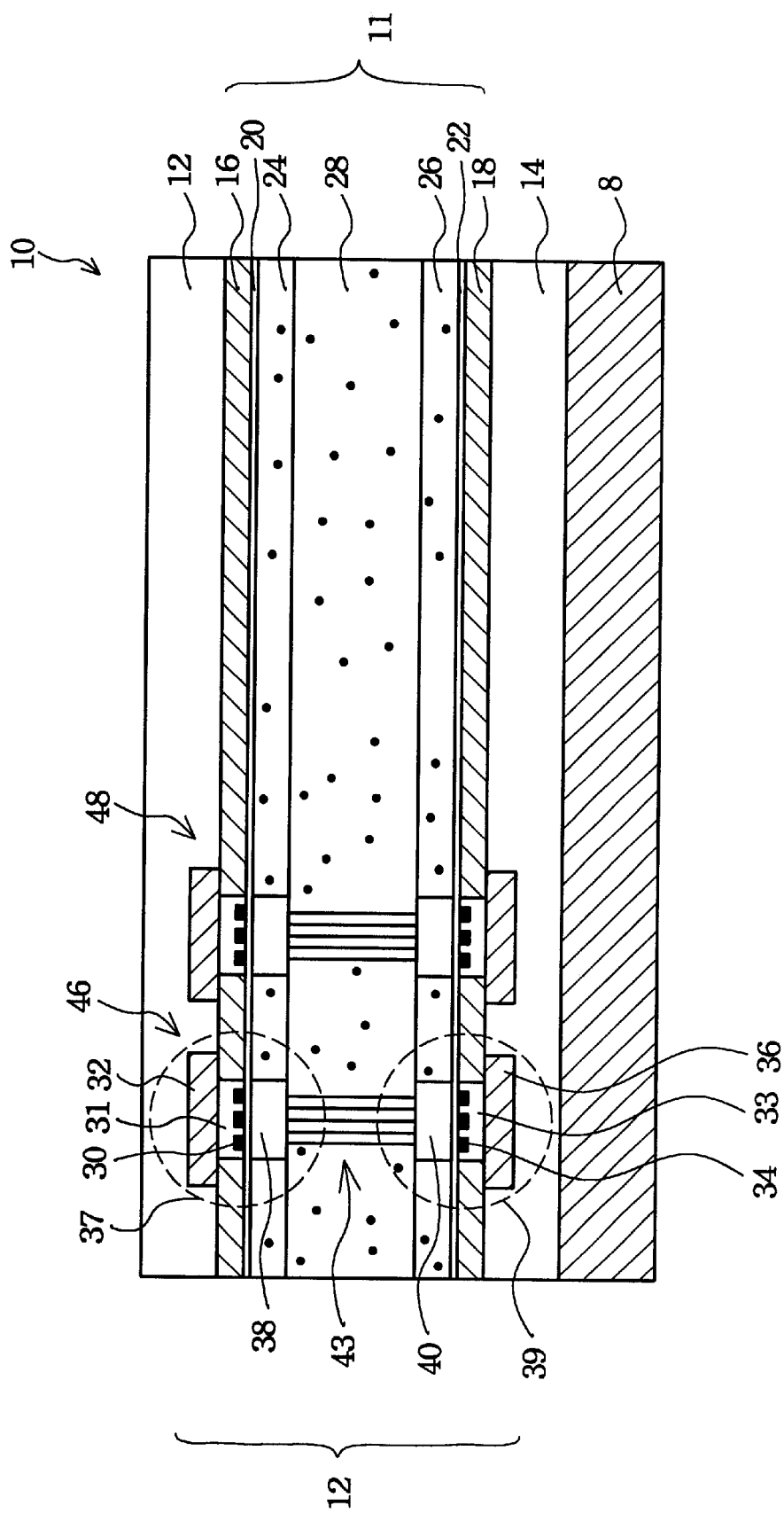
FIG. 2 is a cross-sectional view of this micro cooling engine array system in accordance with the invention.
Figure 3:
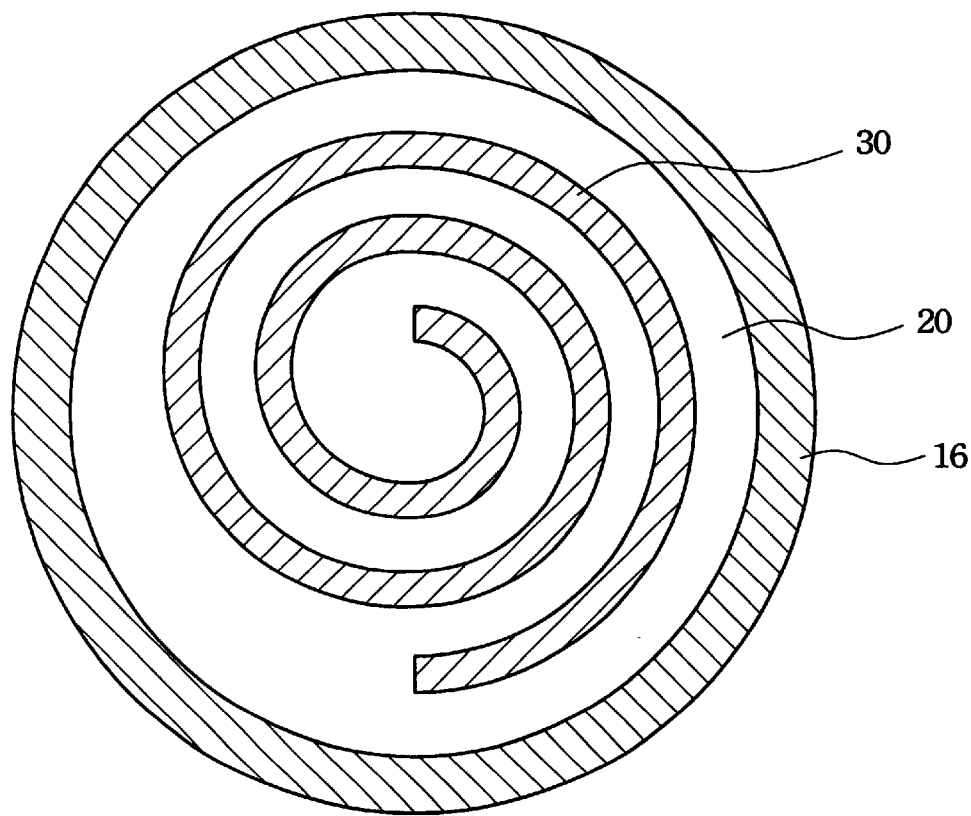
FIG. 3 is a top view of the plane coil of this micro cooling engine array system.

FIG. 2 shows a cross-sectional view of the micro cooling engine array system 10 along the line A—A of FIG. 1. Many micro cooling engines 46, 48 are arrayed and enclosed in a matrix 12, which contains the first plate 14, second plate 12, and laminated layer 11. The micro cooling engine array system 10 is positioned atop the chip 8 by bonding its surface with the first plate. Each stirling cycle the cooling engine 46 or 48 accomplishes pumps an amount of heat from the chip 8 through the first plate 8 to the surroundings of the second plate 12.

The micro cooling engine array system 10 can not only employ to cool the chip 8, but also to cool any heat sources. The matrix 12 can be made of non-silicon materials, such as metal, polymer, and magnetic material, with a thickness approximately under 6 millimeters by MEMS technology. For instance, the first plate 14 and second plate 12 are made of copper, nickel, or tungsten. Several polymer layers substantially stack forming the laminated layer 11, which contains spaces, flexible diaphragms, micro actuators, and buried magnetic regions to constitute cooling engines 46, 48. For each cooling engine of this micro cooling engine array system, as for the cooling engine 46, the first plate 14 and second plate 12 have buried magnetic regions 36, 32, respectively. A first polyimide layer 18 with a first back space 33 is formed on the first plate 14, and then a first flexible diaphragm 22, first adiabatic layer 26, second adiabatic layer 28, third adiabatic layer 24, second flexible diaphragm 20, and second polyimide layer 16 are subsequently stacked up to form an expansion space 40, regenerator 43, compression space 38, and second back space 31. In this embodiment, the first polyimide layer 18, first flexible diaphragm 22, second flexible diaphragm 20, and second polyimide layer 16 are made of materials of polyimide, however metal could also be on of the selections. The main concern of material selection of the first, second, third adiabatic layers 26, 28, and 24 is to prevent heat escaping form the regenerator 43. Therefore, the material of the first, second, third adiabatic layers 26, 28, and 24 could be polyimide. In addition, any two continuous layers of the matrix 12 are tightly bonded with each other, so that the fluid filled in the spaces of cooling engine 43 would not leak out Each cooling engine of the micro cooling engine array system 10 has the same structure with one another. For clearly describing the function scheme of each cooling engine, it would be benefit to introduce the micro cooling engine array system 10 starting at the cooling engine 46. The cooling engine 46 implanted and enclosed in the matrix 12 comprises a heat-absorbing end 39, heat-ejecting end 37, and regenerator 43. These parts of the cooling engine 46 are respectively described as follows.

The heat-absorbing end 39 includes a first back space 33 and expansion space 40, which are separated by the first flexible diaphragm 22, for containing a working fluid, such as helium, nitrogen, in which the first back space 33 is enclosed between the first plate and first flexible diaphragm. The candidates of working fluid are those with low condense temperature, for avoiding the working fluid to condense to liquid while cooling the heat sources. A plane coil 34 is mounted on the first flexible diaphragm 22 at the side of the first back space 33. When the plane coil 34 receives an input voltage, it responsively generates a magnetic force, which induces an attractive force between the first buried magnetic region 36 and plane coil 34. As a result of the attractive force, the first flexible diaphragm 22 deforms toward the first buried magnetic region 36, so as to increase the volume of the expansion space 40. Meanwhile, increased volume of the expansion space 40 enables the working fluid of the heat-absorbing end 39 to absorb heat form the chip 8, namely a heat source, through the first plate 14.

The regenerator 43 is interposed between the heat-absorbing end 39 and heat-ejecting end 37 for allowing the working fluid to flow therein. The structure of the regenerator 43 could be a group of tubes, slots, or foaming materials. Therefore, the working fluid can convey heat between the heat-absorbing end 39 and the heat-ejecting end 37.

The heat-ejecting end 37 includes a second back space 31 and compression space 38, which are separated by the second flexible diaphragm 20, for containing a working fluid, in which the second back space 31 is enclosed between the second plate 12 and second flexible diaphragm 20. A plane coil 30 is mounted on the second flexible diaphragm 20 at the side of the second back space 31. When the plane coil 30 receives an input voltage, it responsively generates a magnetic force, which induces a repulsive force between the second buried magnet region 32 and plane coil 30. As a result of the repulsive force, the second flexible diaphragm 20 deforms outward the second buried magnet region 32, so as to reduce the volume of the compression space 38. Meanwhile, reduced volume of the compression space 38 enables the working fluid of the heat-ejecting end 37 to eject heat out through the second plate 12. By controlling the frequency of the expansion and compression of working fluid, the cooling engine 46 pumps heat out of the chip 8, thus maintaining its temperature in a desired range. Typically, the phase of compression cycle for the working fluid lags behind the expansion cycle about 90°. However, lagged phase could also be adjusted for different optimized designs.

FIG. 2 shows a top view of the second plane coil 30 of the cooling engine 46. By employing MEMS technology, a plane whirl lead, namely the second plane coil 30, can be formed on the second flexible diaphragm 20. Since the second plane coil 30 is quicker in response to generate magnetic forces for deforming the flexible diaphragms than the piezoelectric material of conventional micro-miniature stirling cycle cooling engine is. Therefore, the plane coil serves as a better actuator for deforming flexible diaphragms than the piezoelectric material does.

Besides the advantages brought form the plane coils, the micro cooling engine array system dividing the conventional micro-miniature stirling cycle cooling engine into many arrayed engines provides a better cooling efficiency, since the smaller size of single cooling engine ensures the shorter time to accomplish a stirling cycle. Moreover, in this invention, all the cooling engines can be arrayed according to the thermal distribution of heat source, so as to optimize the efficiency of the micro cooling engine array system. Furthermore, the micro cooling engine array system made of non-silicon materials, such as metal and polymer, avoids the risk of damaging based chips and provides a better flexibility of using this array system.

Figure 4:
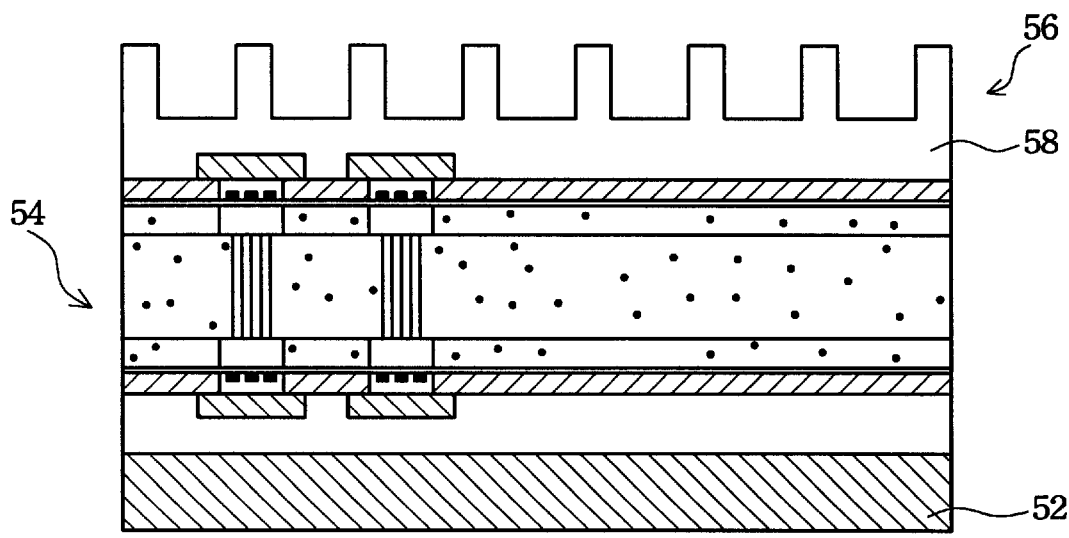
FIG. 4 is a cross-sectional view of an alternative of this micro cooling engine array system.

FIG. 4 shows an alternative of the present micro cooling engine array system. The micro cooling engine array system 54 bonded on a heat source 52 has a top plate 58 with a group of fins 56. Since the fins 56 increase the surface of the top plate 58, the cooling efficiency of the micro cooling engine array system would also improve. It's noticed that the profile of fins is not limited as FIG. 4 presents. Many other profiles of fins for increasing the surface of top plate 58 should be regarded as alternatives in this invention.

As is understood by a person skilled in the art, the foregoing preferred embodiments of the present invention that are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A micro cooling engine array system, which is fabricated by micro electro mechanical system technology, the micro cooling engine array system comprising:
   a matrix, being made of non-silicon materials, and having a first plate, a second plate and a laminated layer being sandwiched in and being bonded between the first plate and the second plate;
   a plurality of micro cooling engines enclosed and arrayed in the matrix, each of the micro cooling engines have a fluid for pumping heat out of a heat source which contacts to the first plate, each of the micro cooling engines further comprising:
      a heat-absorbing end having an expansion space and a first back space touching the first plate, a first flexible diaphragm bonded in the matrix separating the expansion space and the first back space for expanding the expansion space by deforming the first flexible diaphragm, thereby allowing the fluid to absorb heat form the heat source;
      a heat-ejecting end having a compression space and a second back space touching the second plate, a second flexible diaphragm bonded in the matrix separating the compression space and the second back space for compressing the compression space by deforming the second flexible diaphragm, thereby allowing the fluid to eject heat out of the micro cooling engine; and
      a regenerator interposed between the heat-absorbing end and the heat-ejecting end for allowing the fluid to flow therein.

2. The micro cooling engine array system of claim 1, wherein the micro cooling engines are arrayed in the matrix in accordance with heat distribution of the heat source for optimizing cooling efficiency of the micro cooling engine array system.

3. The micro cooling engine array system of claim 1, further comprising a first magnetic region implanted over a bottom surface of the first back space in the first plate.

4. The micro cooling engine array system of claim 3, further comprising a first plane coil mounted opposite to the first magnetic region on the first flexible diaphragm, the first plane coil transducing an input voltage into a magnetic force for deforming the first flexible diaphragm by generating an attractive force between the first plane coil and the first magnetic region, thereby expanding the expansion space.

5. The micro cooling engine array system of claim 1, further comprising a second magnetic region implanted over a top surface of the second back space in the second plate.

6. The micro cooling engine array system of claim 5, further comprising a second plane coil mounted opposite to the second magnetic region on the second flexible diaphragm, the second plane coil transducing an input voltage into a magnetic force for deforming the second flexible diaphragm by generating a repulsive force between the second plane coil and the second magnetic region, thereby compressing the compression space.

7. The micro cooling engine array system of claim 1, wherein the first plate and the second plate are made of a material selected from a group consisting of copper, nickel, and tungsten.

8. The micro cooling engine array system of claim 1, wherein the laminated layer is stacked by layers made of a material selected from a group consisting of metal, adiabatic, and magnetic material.

9. The micro cooling engine array system of claim 1, wherein the first flexible diaphragm and the second diaphragm are made of a material selected from a group consisting of polyimide, and metal.

10. The micro cooling engine array system of claim 1, wherein the second plate has a plurality of fins extruding form a top surface of the second plate for improving the heat-ejecting efficiency of the compression space.

11. The micro cooling engine array system of claim 1, wherein the regenerator has a plurality of tubes therein.

12. The micro cooling engine array system of claim 1, wherein the fluid is helium.

13. A micro cooling engine array system, which is fabricated in an array of miniature stirling cycle coolers by micro electro mechanical system technology for improving cooling efficiency, the micro cooling engine array system comprising:
   a matrix, being made of non-silicon materials, and having a first metal plate, a second metal plate and a laminated layer being sandwiched in and being bonded between the first plate and the second plate;
   a plurality of micro cooling engines enclosed and arrayed in the matrix, each of the micro cooling engines have a fluid for pumping heat out of a heat source which contacts the first metal plate, each of the micro cooling engines further comprising:
      a heat-absorbing end having an expansion space and a first back space touching the first metal plate, a first flexible diaphragm bonded in the matrix separating the expansion space and the first back space;
      a first plane coil mounted on the first diaphragm at a side of the first back space, the first plane coil transducing an input voltage into a magnetic force, thereby generating an attractive force between the first plane coil and a first magnetic region of the first metal plate to deform the first flexible diaphragm to expand the expansion space for allowing the fluid to absorb heat from the heat source;

a heat-ejecting end having a compression space and a second back space touching the second metal plate, a second flexible diaphragm bonded in the matrix separating the compression space and the second back space;

a second plane coil mounted on the second diaphragm at a side of the second back space, the second plane coil transducing the input voltage into a magnetic force, thereby generating an repulsive force between the second plane coil and a second magnetic region of the second metal plate to deform the second flexible diaphragm to compress the compression space for allowing the fluid to eject heat from the micro cooling engine; and a regenerator interposed having a plurality of tubes between the heat-absorbing end the heat-ejecting end for allowing the fluid to flow therein;

wherein the plurality of micro cooling engines are arrayed in the matrix in accordance with heat distribution of the heat source for optimizing cooling efficiency of the micro cooling engine array system.

14. The micro cooling engine array system of claim 13, wherein the first metal plate and the second metal plate are made of a material selected from a group consisting of copper, nickel, and tungsten.

15. The micro cooling engine array system of claim 13, wherein the laminated layer is stacked by layers made of a material selected from a group consisting of metal, adiabatic and magnetic material.

16. The micro cooling engine array system of claim 13, wherein the first flexible diaphragm and the second diaphragm are made of a material selected from a group consisting of polyimide, and metal.

17. The micro cooling engine array system of claim 13, wherein the second metal plate has a plurality of fins extruding from a top surface of the second metal plate for improving the heat-ejecting efficiency of the compression space.

18. The micro cooling engine array system of claim 13, wherein the regenerator has a plurality of tubes therein.

19. The micro cooling engine array system of claim 13, wherein the fluid is helium.

* * * * *